United States Patent
Zhao

(10) Patent No.: US 12,295,213 B2
(45) Date of Patent: May 6, 2025

(54) OLED DISPLAY DEVICE AND MANUFACTURING METHOD THEREOF

(71) Applicants: HUIZHOU CHINA STAR OPTOELECTRONICS DISPLAY CO., LTD., Guangdong (CN); SHENZHEN CHINA STAR OPTOELECTRONICS SEMICONDUCTOR DISPLAY TECHNOLOGY CO., LTD., Guangdong (CN)

(72) Inventor: Yun Zhao, Guangdong (CN)

(73) Assignees: HUIZHOU CHINA STAR OPTOELECTRONICS DISPLAY CO., LTD., Guangdong (CN); SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/618,453

(22) PCT Filed: Nov. 23, 2021

(86) PCT No.: PCT/CN2021/132555
§ 371 (c)(1),
(2) Date: Dec. 11, 2021

(87) PCT Pub. No.: WO2023/082329
PCT Pub. Date: May 19, 2023

(65) Prior Publication Data
US 2024/0016005 A1    Jan. 11, 2024

(30) Foreign Application Priority Data
Nov. 15, 2021 (CN) .......................... 202111348168.8

(51) Int. Cl.
*H10K 59/122* (2023.01)
*H10K 59/12* (2023.01)
*H10K 59/80* (2023.01)

(52) U.S. Cl.
CPC ....... *H10K 59/122* (2023.02); *H10K 59/1201* (2023.02); *H10K 59/873* (2023.02)

(58) Field of Classification Search
CPC . H10K 59/122; H10K 59/1201; H10K 59/873
See application file for complete search history.

(56) References Cited

U.S. PATENT DOCUMENTS

2015/0144917 A1* 5/2015 Koo ................... H10K 59/8722
257/40
2017/0025486 A1    1/2017 Kwon

FOREIGN PATENT DOCUMENTS

CN        103872089 A     6/2014
CN        106910841 A     6/2017
(Continued)

OTHER PUBLICATIONS

International Search Report in International application No. PCT/CN2021/132555, mailed on Jun. 29, 2022.
(Continued)

*Primary Examiner* — Anne M Hines
(74) *Attorney, Agent, or Firm* — PV IP PC; Wei Te Chung

(57) ABSTRACT

An OLED display device and a manufacturing method thereof are provided. The OLED display device includes a base substrate, a plurality of OLED devices, and a plurality of spacers. A plurality of OLED devices are disposed on the base substrate. At least part of the OLED devices are provided with an inorganic layer on a side away from the base substrate. At least part of the spacers are distributed at the gaps between the OLED devices. The OLED display (Continued)

device can prevent a problem of degradation of display quality due to external impact.

19 Claims, 4 Drawing Sheets

(56) References Cited

FOREIGN PATENT DOCUMENTS

| | | | |
|---|---|---|---|
| CN | 107706226 A | 2/2018 |
| CN | 107808896 A | 3/2018 |
| CN | 108461527 A | 8/2018 |
| CN | 110335958 A | 10/2019 |
| CN | 110911583 A | 3/2020 |
| CN | 111490088 A | 8/2020 |
| CN | 111554827 A | 8/2020 |
| CN | 113421910 A | 9/2021 |

OTHER PUBLICATIONS

Written Opinion of the International Search Authority in International application No. PCT/CN2021/132555, mailed on Jun. 29, 2022.
Chinese Office Action issued in corresponding Chinese Patent Application No. 202111348168.8 dated Sep. 23, 2022, pp. 1-8.

* cited by examiner

OLED DISPLAY DEVICE AND MANUFACTURING METHOD THEREOF

FIELD OF INVENTION

The present application relates to display technologies, and more particularly, to an OLED display device and manufacturing method thereof.

BACKGROUND OF INVENTION

Organic light-emitting display (OLED) is a self-luminous device with a series of advantages such as high brightness, full viewing angle, fast response speed, and flexible display. Organic light-emitting diode display devices can be divided into passive matrix OLED (PMOLED) and active matrix OLED (AMOLED) according to the driving mode. AM display devices have higher luminous efficiency and can be used as high-resolution large-size display devices.

A traditional glass glue encapsulating method is no longer applicable due to stress issues when manufacturing large-size top-emitting organic light-emitting substrates. Large-size top-emitting organic light-emitting substrates are usually encapsulated by dam & fill encapsulating. The dam glue has an effect of blocking water and oxygen, and the filling glue can relieve an external pressure on the organic light-emitting substrate and further isolate the water and oxygen. Dam&Fill encapsulating has the advantages of high encapsulating flexibility, stability and reliability, and is suitable for encapsulating large-size organic light-emitting substrates The size of a back cover glass of the currently large-size OLED display devices is relatively large, such as monitors, TVs, etc., with a size of 25 inches or more, or even 80 inches or more. Because a central region of the back cover glass does not have the same support as Dam glue. Therefore, the back cover glass is easily deformed by external impact, which causes a certain stress on the back cover glass and the base substrate, which in turn causes a problem of degraded display quality of the OLED display device.

SUMMARY OF INVENTION

The present application provides an OLED display device and a manufacturing method thereof. The OLED display device can solve a problem that a display quality of the OLED display device is reduced due to lack of support in the central region of the currently large-size OLED display device.

In a first aspect, embodiments of the present application provide an OLED display device, including: a base substrate;
 a plurality of OLED devices disposed on the base substrate at intervals, wherein at least some of the OLED devices provide with inorganic layers;
 a plurality of spacers disposed on the base substrate and correspondingly arranged at positions where no inorganic layers disposed;
 a pixel defining layer comprises a plurality of first openings to provide limits of the OLED devices, wherein a material of the pixel defining layer is a high molecular polymer, and wherein at least some of the spacers dispose on the pixel defining layer; and
 an encapsulating cover, wherein edges of the encapsulating cover and the base substrate are bonded and fixed by a frame sealant, and wherein the spacers are disposed between the encapsulating cover and the base substrate.

Optionally, in some embodiments of the present application, the spacers are distributed in a gap between two adjacent OLED devices.

Optionally, in some embodiments of the present application, the spacers are distributed at least part of the gaps between the OLED devices.

Optionally, in some embodiments of the present application, each of the OLED devices is provided with the inorganic layer.

Optionally, in some embodiments of the present application, at least some of the inorganic layers comprises a second opening, and some of the spacers are disposed on the second opening.

Embodiments of the present application provides another OLED display device, includes:
 a base substrate;
 a plurality of OLED devices disposed on the base substrate at intervals, wherein at least some of the OLED devices provide with inorganic layers; and
 a plurality of spacers disposed on the base substrate and correspondingly arranged at positions where no inorganic layers disposed.

Optionally, in some embodiments of the present application, the OLED display device further includes a pixel defining layer including a plurality of first openings to define the OLED device, wherein a material of the pixel defining layer is a high molecular polymer, and wherein at least some of the spacers disposed on the pixel defining layer.

Optionally, in some embodiments of the present application, the inorganic layer is provided on a side of the OLED device far away from the base substrate.

Optionally, in some embodiments of the present application, the spacers are distributed in a gap between two adjacent OLED devices.

Optionally, in some embodiments of the present application, the spacers are distributed at least part of the gaps between the OLED devices.

Optionally, in some embodiments of the present application, at least some of the inorganic layers includes a second opening, and some of the spacers are disposed on the second opening.

Optionally, in some embodiments of the present application, the encapsulating structure further comprises an encapsulating cover, wherein edges of the encapsulating cover and the base substrate are bonded and fixed by a frame sealant, and wherein the spacers are disposed between the encapsulating cover and the base substrate.

On the other hand, the present application provides a method of manufacturing an OLED display device, including the following steps:
 providing a plurality of OLED devices on a base substrate;
 providing an inorganic layer on a side of the OLED device away from the base substrate;
 spraying a plurality of spacers on the base substrate; and
 heating the base substrate and turning the base substrate over to let the spacers of the OLED device fall off.

Optionally, in some embodiments of the present application, the step of providing the OLED devices on the base substrate further comprises:
 providing a pixel defining layer on the base substrate, wherein the pixel defining layer comprises a plurality of first openings to provide limits of the OLED devices, and wherein a material of the pixel defining layer is a high molecular polymer.

Optionally, in some embodiments of the present application, the spacers are distributed in a gap between two adjacent OLED devices.

Optionally, in some embodiments of the present application, the spacers are distributed at least part of the gaps between the OLED devices.

Optionally, in some embodiments of the present application, each of the OLED devices is provided with the inorganic layer Optionally, in some embodiments of the present application, at least some of the inorganic layers includes a second opening, and some of the spacers are disposed on the second opening Optionally, in some embodiments of the present application, the step of heating the base substrate and turning the base substrate over to let the spacers on the OLED device fall off further comprises:

heating the base substrate and turning the base substrate over to let the spacers of the OLED device fall off and to let the spacers located on the pixel defining layer fix, wherein wherein a heating temperature ranges from 60° C. to 100° C.; and turning the base substrate over again to let the OLED device face the encapsulating cover, wherein the base substrate and the edges of the packaging cover plate are bonded and fixed by a frame sealant to form the OLED display device.

Compared with the lack of support in the central region of the prior art OLED display device, the OLED display device provided by the present application includes: a base substrate, a plurality of OLED devices, and a plurality of spacers. A plurality of OLED devices are disposed on the base substrate. At least some of the OLED devices are provided with an inorganic layer on a side away from the base substrate. At least some of the spacers are distributed at the gaps between the OLED devices. The OLED display device provided by the present application is provided with spacers, and on the basis of ensuring the process yield, a problem of the display quality degradation of the OLED display device due to external impact can be avoided.

DESCRIPTION OF FIGURES

In order to more clearly describe the technical solutions in the embodiments of the present application, the following will briefly introduce the figures used in the description of the embodiments. The figures in the following description are only some embodiments of the present application. For those skilled in the art, without inventive steps, other figures can be obtained based on these figures.

FIG. 1b is a partial cross-sectional view taken along a line I-I' of the OLED display device of FIG. 1a.

DETAILED DESCRIPTION OF EMBODIMENTS

The technical solutions in the embodiments of the present application will be clearly and completely described below in conjunction with the figures in the embodiments of the present application. Obviously, the described embodiments are only a part of the embodiments of the present application, rather than all the embodiments. Based on the embodiments in the present application, all other embodiments obtained by those skilled in the art without inventive steps shall fall within a protection scope of the present application.

The embodiments of the present application provide an OLED display device and a manufacturing method thereof. The OLED display device can solve the problem that a display quality of the OLED display device is reduced due to the lack of support in the central region of the currently large-size OLED display device. Detailed descriptions are provided below. It should be noted that an order of description in the following embodiments is not meant to limit a preferred order of the embodiments. In addition, in the description of the present application, a term "including" means "including but not limited to". The terms "first", "second", "third", etc. are only used as labels, which are used to distinguish different objects, rather than to describe a specific sequence.

Figure 1A:
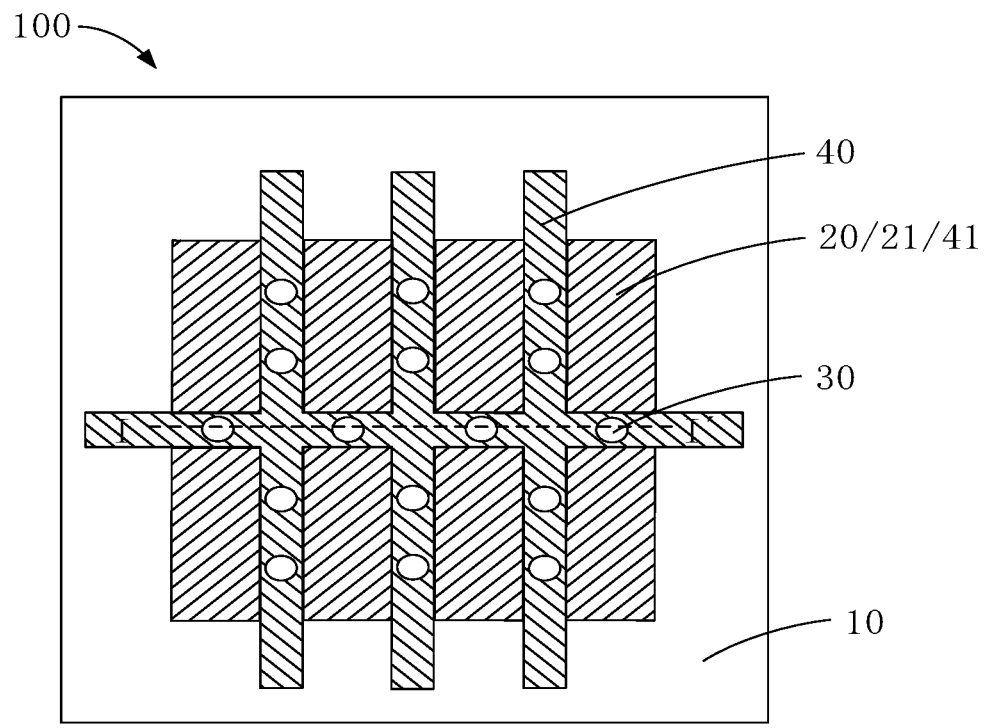
FIG. 1a is a partial top view of a first OLED display device provided by one embodiment of the present application.

Please refer to FIG. 1a, which is a partial top view of a first OLED display device provided by one embodiment of the present application. As shown in FIG. 1a, the present application provides an OLED display device 100, includes a base substrate 10, a plurality of OLED devices 20, and a plurality of spacers 30. A plurality of OLED devices 20 are disposed on the base substrate 10 at intervals. At least some of the OLED devices 20 are provided with an inorganic layer 21. A plurality of spacers 30 are disposed on the base substrate 10 and correspondingly disposed at positions where the inorganic layers 21 not disposed.

In the embodiment of the present application, the base substrate 10 may be a glass substrate or a flexible polyimide substrate. The base substrate 10 is used to carry an overall structure of the OLED display device 100. A plurality of sub-pixels are provided on the base substrate 10, and the plurality of sub-pixels include a plurality of light-emitting regions.

In the embodiment of the present application, the OLED display device 100 further includes a pixel defining layer 40. The pixel defining layer 40 includes a plurality of first openings 41 to define the plurality of OLED devices 20. A material of the pixel defining layer 40 is a high molecular polymer. At least some of the spacer 30 are disposed on the pixel definition layer 40. Specifically, each sub-pixel includes a light-emitting element (not shown in the figure). The light-emitting element includes a first electrode, a light-emitting layer, and a second electrode that are stacked. The second electrode is positioned on a side of the light-emitting layer close to the base substrate 10 or at least some of the second electrodes are positioned on a side of the pixel defining layer 40 close to the base substrate 10. The light emitting layer is formed in the first opening 41 of the pixel defining layer 40, the first electrodes and the second electrodes positioned on both sides of the light emitting layer can drive the light emitting layer in the first opening 41 of the pixel defining layer 40 to emit light.

In this embodiment of the present application, a functional layer (not shown in the figure) is further provided in at least one of between the light-emitting layer and the first electrode or between the light-emitting layer and the second electrode. The functional layer includes any one or multi-layer of a hole injection layer, a hole transport layer, an electron transport layer, a hole blocking layer, an electron blocking layer, an electron injection layer, an auxiliary light emitting layer, an interface improvement layer, an antireflection layer, etc.

In this embodiment of the present application, an orthographic projection of the first opening 41 of the pixel defining layer 40 on the base substrate 10 is positioned within an orthographic projection of the corresponding light-emitting layer on the base substrate 10. That is, the light-emitting layer covers the pixel defining layer 40. A shape of the light-emitting region of each sub-pixel is substantially the same as a shape of the first opening 41 of the pixel defining layer 40. An area of the light-emitting layer is larger than an area of the first opening 41 of the corresponding pixel defining layer 40. That is, the light-emitting layer, in addition to the part located inside the first opening 41 of the pixel defining layer 40, also includes at least a part of physical structure covering the pixel defining layer 40. Generally, the physical structure of the pixel defining layer 40 at each boundary of the first opening 41 of the pixel defining layer 40 covers the light-emitting layer. In this embodiment of the present application, a material of the pixel defining layer 40 is a high molecular polymer, which specifically includes at least one of phenol-formaldehyde polymers, acrylic esters, fused cyclic olefin additions, and the like. Since a material of the spacers 30 in the present application has a stronger bonding force with the polymer material after heating, the material of the pixel defining layer 40 is designed with a polymer material, which is beneficial to reduce a probability of the spacers 30 falling off or shifting under an action of external force, thereby beneficial to improve a process yield of the product.

In this embodiment of the present application, the spacers 30 are adopted of a plastic, glass, or silicone resin material. For example, the spacers 30 may be spherical particles, beads spacer, and photo spacers formed by plastic-based acrylic resin, and cylindrical (or rod-shaped) particles, spherical particles formed by glass resins, and spherical particles formed by silicone resins. The spacers 30 are formed of a transparent material with a refractive index less than 1.5, so it will not affect a display quality of the OLED display device 100.

In this embodiment of the present application, at least some of the OLED device 20 is provided with an inorganic layer 21 on a side away from the base substrate 10. A material of the inorganic layer 21 includes silicon nitride, silicon oxide, silicon oxynitride, silicon oxycarbide, and silicon carbonitride, etc. Preferably, in the OLED display device shown in FIG. 1a, an inorganic layer 21 is provided on a side of the OLED device 20 away from the base substrate 10. In actual operation, only part of the side of the OLED devices 20 away from the base substrate 10 may be provided with an inorganic layer 21, which can be adjusted by a technician according to actual needs, and which is not limited in the present application. Since the material of the spacer 30 in the present application repels the inorganic material after heating, the side of the OLED devices 20 away from the base substrate 10 is provided with the inorganic layer 21, which is beneficial that during the manufacturing process of the OLED display device 100, the spacers 30 will not be attached to the side of the OLED devices far from the base substrate 10. Therefore, the arrangement of the spacer 30 will not affect the display quality of the OLED display device 100.

In this embodiment of the present application, a thin film transistor layer (not shown in the figure) is further provided on the base substrate 10. The thin film transistor layer may be one or more of a low temperature polysilicon thin film transistor layer, a metal oxide thin film transistor layer, or an amorphous silicon thin film, etc. The thin film transistor layer is used to control the light emission of the OLED devices 20 and provide power to the OLED devices 20. The OLED devices 20 are disposed on the surface of the thin film transistor layer away from the base substrate 10, and the first electrodes in the OLED devices 20 are electrically connected to the thin film transistor layer.

In this embodiment of the present application, the spacers 30 are spherical or cylindrical. The plurality of spacers 30 are uniformly or unevenly disposed on a side of the pixel defining layer 40 away from the base substrate 10. The plurality of spacers 30 are distributed at the gaps between adjacent first openings 41 of the pixel defining layer 40. The aforementioned gaps refer to the physical structure of the pixel defining layer 40 between adjacent first openings 41. That is, the spacers 30 are positioned on the physical structure of the pixel defining layer 40. By disposing spacers 30 at the gap between two adjacent first openings 41 of the pixel defining layer 40, it is beneficial to improve a process yield or enhance a supporting effect of the spacers 30. In the OLED display device shown in FIG. 1a, the spacers 30 are distributed at the gap between two adjacent OLED devices 20, that is, disposed at the gap between two adjacent first openings 41 of the pixel defining layer 40.

In this embodiment of the present application, a cross-sectional length of the spacer 30 is not greater than 10 microns. Specifically, shapes of the spacers 30 may be the same or different. The shape of the spacer 30 may refer to a shape of the orthographic projection of the spacer 30 on the base substrate 10. Sizes of the spacers 30 may be the same or different, the size of the spacer 30 may refer to an area of the orthographic projection of the spacer 30 on the base substrate 10. Cross-sectional heights of the spacers 30 perpendicular to the base substrate 10 are all equal, or a deviation is within 5% of the height value. Cross-sectional areas of the spacers 30 parallel to the base substrate 10 may be the same or different. Preferably, as shown in FIG. 1a, all the spacers 30 have the same shape and size and the same cross-sectional height.

In this embodiment of the present application, the spacers 30 may all be spherical, for example, the spacers 30 are all plastic balls, and a plurality of plastic balls are evenly distributed in the gaps between adjacent first openings 41 of the pixel defining layer 40. Alternatively, the spacers 30 may all be cylindrical, for example, the spacers 30 are all glass rods, and a plurality of glass rods are evenly distributed at the gaps between adjacent first openings 41 of the pixel defining layer 40. Alternatively, the spacers 30 may also include a spherical shape and a cylindrical shape. For example, the spacers 30 include a plastic ball and a glass rod, and a plurality of plastic balls and a plurality of glass rods are evenly distributed in the adjacent first openings of the pixel defining layer 40. A number of plastic balls and glass rods can be the same or different, and a number ratio of plastic balls to glass rods can be 0.1 to 1, 0.2 to 0.9, 0.3 to 0.8, 0.4 to 0.7, or 0.5 to 0.6. The number ratio can refer to a ratio of the number of plastic balls to the number of glass rods. It can also refer to the ratio of the number of glass rods to the number of plastic balls. The spacers 30 are evenly distributed at the gaps between the adjacent first openings 41 of the pixel defining layer 40, which is beneficial to reduce a manufacturing process difficulty of the spacers 30 and improve a supporting effect of the spacers 30.

In this embodiment of the present application, the shape of the spacer 30 may also be a regular shape such as a circle, an ellipse, a diamond, a square, etc., or an irregular shape, which can be set according to actual product requirements.

In this embodiment of the present application, a distribution density of the spacers 30 is not specifically limited, and can be adjusted according to actual needs.

Figure 1B:
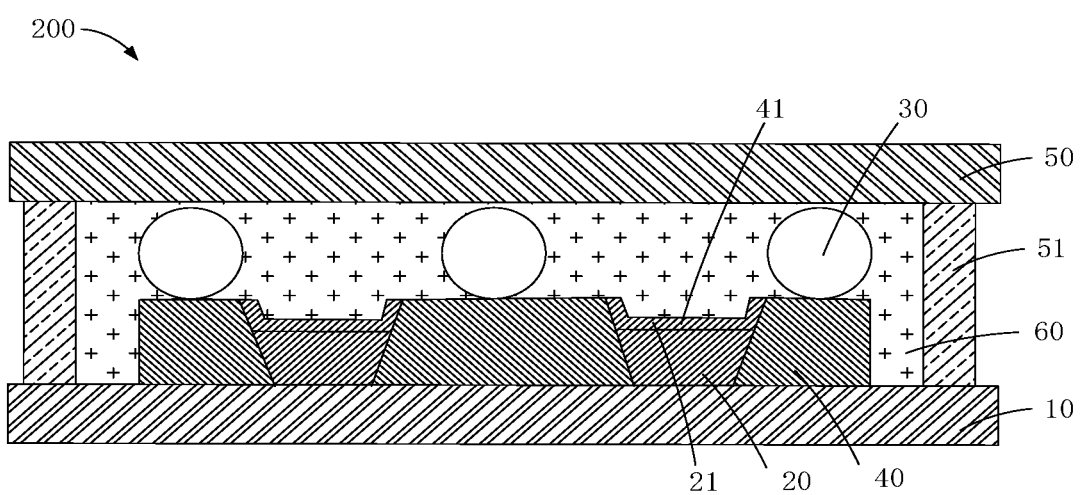

In this embodiment of the present application, the OLED display device 200 further includes an encapsulating cover 50, as shown in FIG. 1b, which is a schematic cross-sectional structure diagram of an OLED display device provided by one embodiment of the present application. The encapsulating cover 50 of the OLED display device 200 and edges of the base substrate 10 are bonded and fixed by a frame sealant 51. The spacers 30 are disposed between the encapsulation cover 50 and the base substrate 10. Specifically, there is a filler region 52 between the encapsulating cover 50 and the base substrate 10. The filler region 52 is configured to accommodate the filler for encapsulating. The filler can fill a space between the encapsulating cover 50 and the base substrate 10 corresponding to the filler region 52 when encapsulating the box. Specifically, a material of the filler includes a polymethyl acrylate.

Figure 2A:
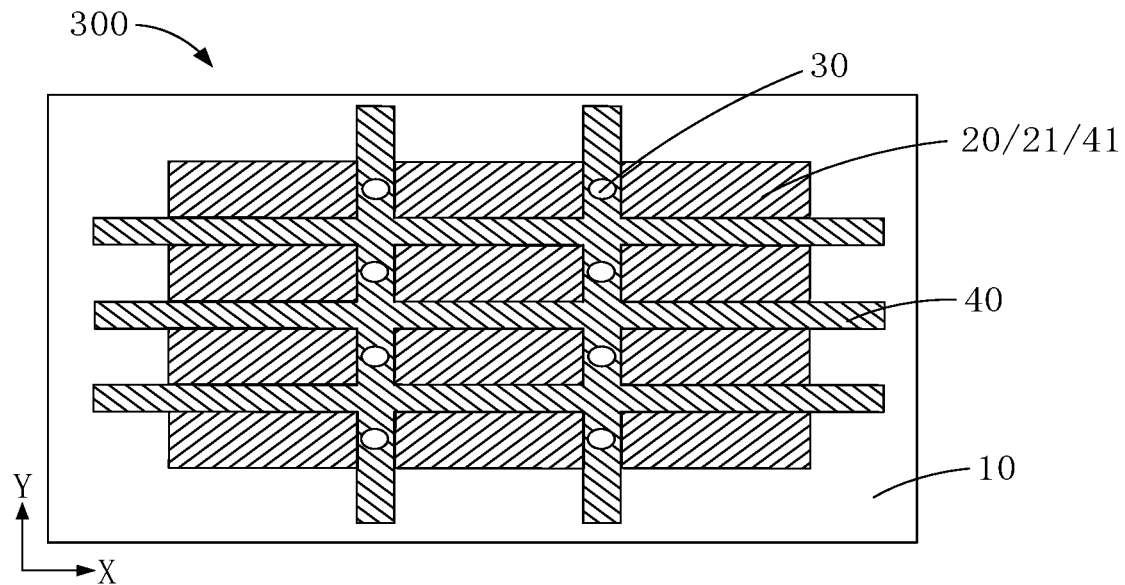
FIG. 2a is a partial top view of a second type of OLED display device provided by one embodiment of the present application.

As a specific embodiment of the present application, please refer to FIGS. 2a to 2d. FIG. 2a is a partial top view of a second type of OLED display device provided by one embodiment of the present application. In this embodiment of the present application, the spacers 30 are distributed on the pixel defining layer 40, and only distributed between some of the first openings 41. FIGS. 2a to 2d show different distribution modes of the spacers 30.

As shown in FIG. 2a, a long side of the OLED display device 300 is in a first direction X, the spacers 30 are uniformly distributed on the pixel defining layer 40 along the first direction X.

Figure 2B:
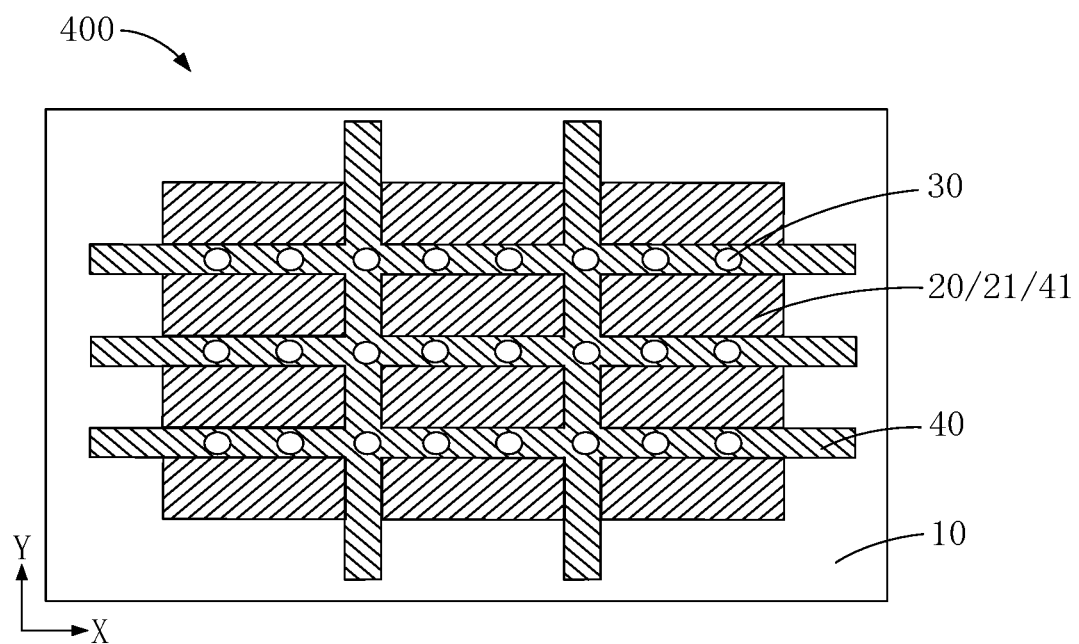
FIG. 2b is a partial top view of a third OLED display device provided by one embodiment of the present application.

FIG. 2b is a partial top view of a third OLED display device provided by one embodiment of the present application. As shown in FIG. 2b, a short side of the OLED display device 400 is in a second direction Y, and the spacers 30 are uniformly distributed on the pixel defining along the second direction Y.

Figure 2C:
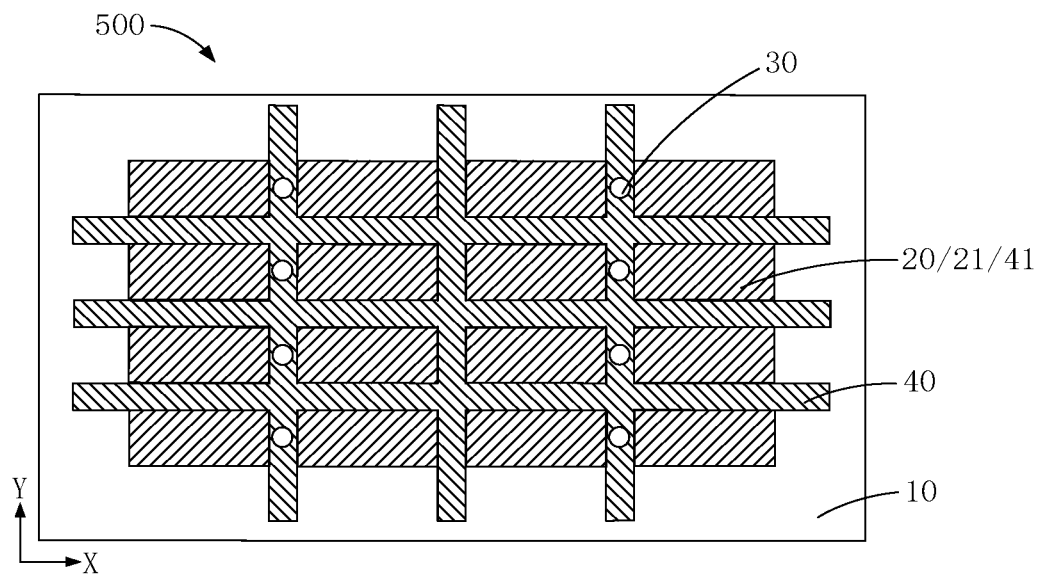
FIG. 2c is a partial top view of a fourth OLED display device provided by one embodiment of the present application.

FIG. 2c is a partial top view of a fourth OLED display device provided by one embodiment of the present application. As shown in FIG. 2c, the spacers 30 may also be distributed on the pixel definition layer 40 at intervals along the first direction X.

Figure 2D:
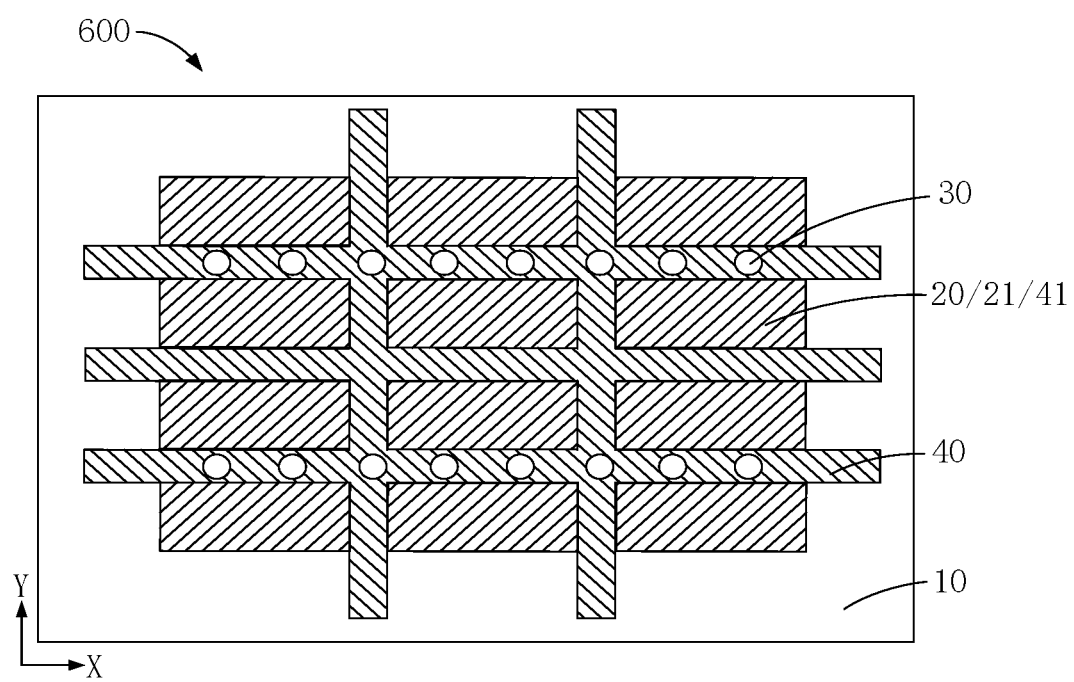
FIG. 2d is a partial top view of a fifth OLED display device provided by one embodiment of the present application.

FIG. 2d is a partial top view of a fifth OLED display device provided by one embodiment of the present application. As shown in FIG. 2d, the spacers 30 are distributed on the pixel defining layer 40 at intervals along the second direction Y.

Figure 3:
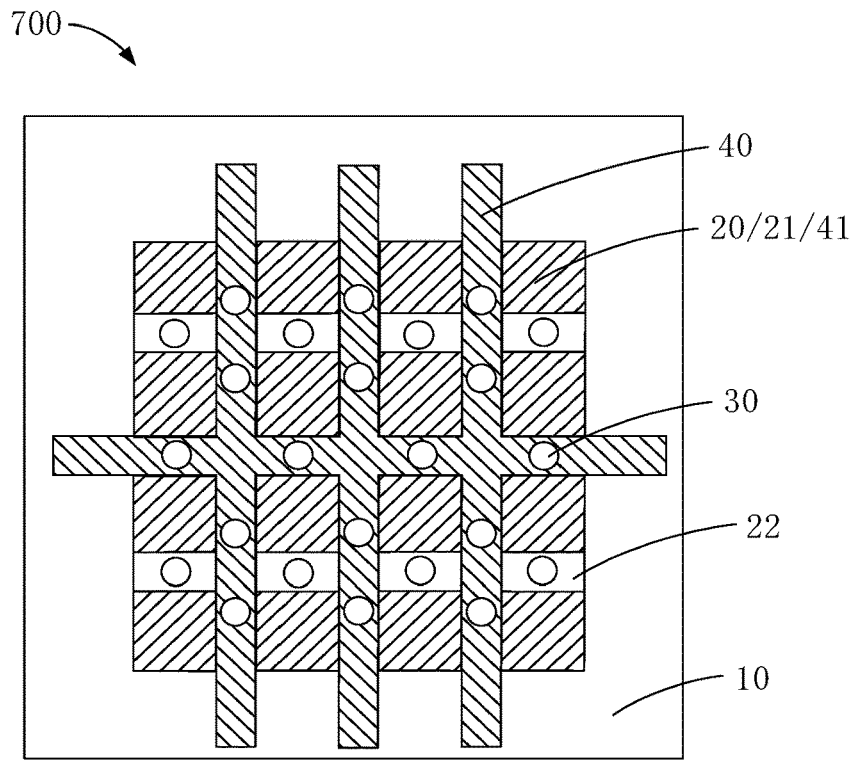
FIG. 3 is a partial top view of a sixth OLED display device provided by one embodiment of the present application.

As a specific embodiment of the present application, please refer to FIG. 3. FIG. 3 is a partial top view of a sixth OLED display device provided by one embodiment of the present application. As shown in FIG. 3, some of the inorganic layers 21 in the OLED display device 700 include a plurality of the second openings 22, some of the spacers 30 are disposed on the second openings 22. A shape of the second opening 22 may be an elongated shape, and the inorganic layer 21 is divided into two parts. Specifically, each of the inorganic layers 21 in the OLED display device 700 may also include the second opening 22. The shape of the second opening 22 may be a regular or irregular shape such as a long strip, a circle, a square, etc., which is not limited in the present application. Such a structural design is beneficial to increase a distribution density of the spacers 30 to improve an overall supporting effect of the spacers 30 on the display device.

Figure 4:
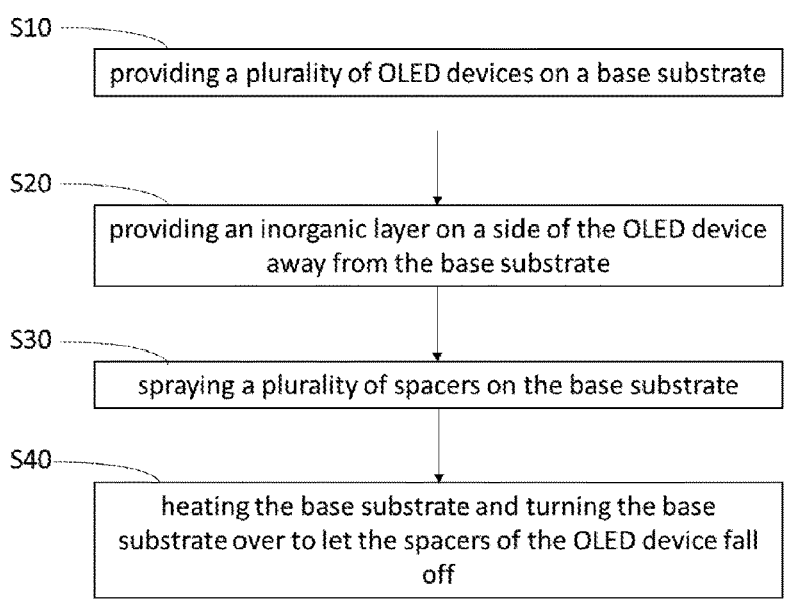
FIG. 4 is a schematic flowchart of a manufacturing method of an OLED display device provided by one embodiment of the present application.

On the other hand, the present application provides a method of manufacturing an OLED display device. Please refer to FIG. 4. FIG. 4 is a schematic flowchart of a manufacturing method of an OLED display device provided by one embodiment of the present application. As shown in FIG. 4, it includes the following steps:

S10, providing a plurality of OLED devices 20 on a base substrate 10.

Specifically, a variety of methods can be used to manufacture the OLED devices 20 on a surface of the array substrate, which is not limited in the present application. For example, the OLED devices 20 can be manufactured on a surface of the array substrate through an evaporation process. In the embodiments of the present application, a specific type of the substrate is not particularly limited, and those skilled in the art can make a selection according to actual needs. For example, the substrate may be glass.

In this embodiment of the present application, the step of manufacturing the OLED device 20 on the base substrate 10 specifically further includes: manufacturing a pixel defining layer 40 on the base substrate 10, wherein a material of the pixel defining layer 40 is a high molecular polymer.

In this embodiment of the present application, the material of the pixel defining layer 40 is a high molecular polymer, which specifically includes at least one of phenol-formaldehyde polymers, acrylic esters, fused cyclic olefin additions, and the like. Since a material of the spacers 30 in the present application has a stronger binding force with the polymer material after heating, the material of the pixel defining layer 40 is designed with a polymer material, which is beneficial to reduce a probability of the spacers 30 falling off or shifting under an action of external force, thereby beneficial to improve a process yield of the product.

S20, providing an inorganic layer 21 on a side of the OLED device 20 away from the base substrate 10.

In this embodiment of the present application, a side of the plurality of OLED devices 20 away from the base substrate 10 includes an inorganic layer 21, and a material of the inorganic layer 21 includes silicon nitride, silicon oxide, silicon oxynitride, silicon oxycarbide, silicon carbonitride, etc. Since the material of the spacer 30 in the present application repels the inorganic material after heating, the side of the OLED devices 20 away from the base substrate 10 is provided with the inorganic layer 21, which is beneficial that during the manufacturing process of the OLED display device 100, the spacers 30 will not be attached to the side of the OLED devices far from the base substrate 10. Therefore, the arrangement of the spacer 30 will not affect the display quality of the OLED display device 100.

S30. Spraying a plurality of spacers 30 on the base substrate 10.

The spacers 30 are adopted of a plastic, glass, or silicone resin material. For example, the spacers 30 may be spherical particles, beads spacer, and photo spacers formed by plastic-based acrylic resin; cylindrical (or rod-shaped) particles, spherical particles formed by glass resins; and spherical particles formed by silicone resins. The spacers 30 are formed of a transparent material with a refractive index less than 1.5, so it will not affect a display quality of the OLED display device 100.

In this embodiment of the present application, the spacers 30 are spherical or cylindrical. The plurality of spacers 30 are uniformly or unevenly disposed on a side of the pixel defining layer 40 away from the base substrate 10. The plurality of spacers 30 are distributed at the gaps between adjacent first openings 41 of the pixel defining layer 40. The aforementioned gaps refer to the physical structure of the pixel defining layer 40 between adjacent first openings 41. That is, the spacers 30 are positioned on the physical structure of the pixel defining layer 40. By disposing spacers 30 at the gap between two adjacent first openings 41 of the pixel defining layer 40, it is beneficial to improve the process yield or enhance the supporting effect of the spacers 30.

In this embodiment of the present application, a cross-sectional length of the spacer 30 is not greater than 10 microns. Specifically, shapes of the spacers 30 may be the same or different. The shape of the spacer 30 may refer to a shape of the orthographic projection of the spacer 30 on the base substrate 10. Sizes of the spacers 30 may be the same or different, the size of the spacer 30 may refer to an area of the orthographic projection of the spacer 30 on the base substrate 10. Cross-sectional heights of the spacers 30 perpendicular to the base substrate 10 are all equal, or a deviation is within 5% of the height value. Cross-sectional areas of the spacers 30 parallel to the base substrate 10 may be the same or different. Preferably, as shown in FIG. 1a, all the spacers 30 have the same shape and size and the same cross-sectional height.

In this embodiment of the present application, the spacers 30 may all be spherical, for example, the spacers 30 are all plastic balls, and a plurality of plastic balls are evenly distributed in the gaps between adjacent first openings 41 of the pixel defining layer 40. Alternatively, the spacers 30 may all be cylindrical, for example, the spacers 30 are all glass rods, and a plurality of glass rods are evenly distributed at the gaps between adjacent first openings 41 of the pixel defining layer 40. Alternatively, the spacers 30 may also include a spherical shape and a cylindrical shape. For example, the spacers 30 include a plastic ball and a glass rod, and a plurality of plastic balls and a plurality of glass rods are evenly distributed in the adjacent first openings of the pixel defining layer 40. A number of plastic balls and glass rods can be the same or different, and a number ratio of plastic balls to glass rods can be 0.1 to 1, 0.2 to 0.9, 0.3 to 0.8, 0.4 to 0.7, or 0.5 to 0.6. The number ratio can refer to a ratio of the number of plastic balls to the number of glass rods. It can also refer to the ratio of the number of glass rods to the number of plastic balls. The spacers 30 are evenly distributed at the gaps between the adjacent first openings 41 of the pixel defining layer 40, which is beneficial to reduce a manufacturing process difficulty of the spacers 30 and improve a supporting effect of the spacers 30.

In this embodiment of the present application, the shape of the spacer 30 may also be a regular shape such as a circle, an ellipse, a diamond, a square, etc., or an irregular shape, which can be set according to actual product requirements.

S40, heating the base substrate 10 and turning the base substrate 10 over to let the spacers 30 of the OLED devices 20 fall off.

In the embodiment of the present application, a temperature at which the base substrate 10 is heated ranges from 60° C. to 100° C., and preferably, the base substrate 10 sprayed with the spacers 30 is heated to 80° C.

Since the spacers 30 in the present application are formed of plastic, glass or silicon-based resin materials, the side away from the base substrate 10 of the OLED devices 20 are provided with inorganic layers. After the spacers 30 are heated, the spacers 30 and the inorganic layers 21 positioned in the area of the OLED device 20 repel each other and fall off. The pixel defining layer 40 is made of high molecular polymer material, and the material of the spacers 30 has a stronger bonding force with the high molecular polymer material after heating. Therefore, the spacers 30 on the gaps of the first opening 41 of the pixel defining layer 40 are attached to the pixel defining layer 40, which is beneficial to reduce a probability of the spacers 30 falling off or shifting under an action of external force, thereby beneficial to improve a process yield of the product.

In this embodiment of the present application, the step of heating the base substrate 10 and turning the base substrate 10 over, to fall the spacers 30 on the OLED device 20 off specifically includes: turning the base substrate 10 over again to make the OLED device 20 faces the encapsulating cover 50. The base substrate 10 and the edges of the encapsulating cover 50 are bonded and fixed by a frame sealing glue 51 to form the OLED display device.

In the OLED display device provided by the present application, spacers 30 are disposed at the gap between two adjacent first openings 41 of the pixel defining layer 40. Such a structural design can improve the spacers on the basis of ensuring the process yield, the supporting effect of the spacers 30 can be improved, and the display quality problem of the OLED display device 100 caused by external impact can be prevented. In general, the OLED display device has better brightness uniformity and better display quality.

The OLED display device can be any product or component with display function such as liquid crystal panel, electronic paper, OLED panel, mobile phone, tablet computer, television, monitor, notebook computer, digital photo frame, navigator, monitor, etc.

The OLED display device and its manufacturing method provided in the embodiments of the present application are described in detail above. Specific examples are used in this article to illustrate the principles and embodiments of the present application. The descriptions of the above embodiments are only used to help understand the present application. At the same time, for those skilled in the art, according to the ideas of the present application, there will be changes in the specific implementation and a scope of the present application. In summary, the content of the specification should not be construed as a reference to limit the present application.

What is claimed is:

1. An OLED display device, comprising:
   a base substrate;
   a pixel defining layer comprising a plurality of first openings, wherein a material of the pixel defining layer is a polymer;
   a plurality of OLED devices disposed on the base substrate at intervals and disposed in the plurality of first openings, respectively, wherein at least some of the OLED devices provide with inorganic layers, the inorganic layers are completely located in the first openings to cover the OLED devices, and the inorganic layers are made of an inorganic material; and
   a plurality of spacers disposed on the base substrate and correspondingly arranged at positions where no inorganic layers disposed, wherein at least some of the spacers are disposed on the pixel defining layer.

2. The OLED display device according to claim 1, wherein the spacers are distributed in a gap between two adjacent OLED devices.

3. The OLED display device according to claim 1, wherein the spacers are distributed at least part of the gaps between the OLED devices.

4. The OLED display device according to claim 1, wherein each of the OLED devices is provided with the inorganic layer.

5. The OLED display device according to claim 1, wherein at least some of the inorganic layers comprise a plurality of second openings, and some of the spacers are disposed on the second openings.

6. The OLED display device according to claim 1, wherein the OLED display device further comprises an encapsulating cover, wherein edges of the encapsulating cover and the base substrate are bonded and fixed by a frame sealant, and wherein the spacers are disposed between the encapsulating cover and the base substrate.

7. The OLED display device according to claim 1, wherein a bonding force between the spacers and the pixel defining layer is larger than a bonding force between the spacers and the inorganic layers after heating.

8. The OLED display device according to claim 7, wherein the polymer of the pixel defining layer comprises at least one of phenol-formaldehyde polymers, acrylic esters, and fused cyclic olefin additions.

9. The OLED display device according to claim 7, wherein the spacers are made of a resin material.

10. The OLED display device according to claim 9, wherein the resin material comprises plastic, glass, or silicone resin materials.

11. The OLED display device according to claim 7, wherein the inorganic material comprises silicon nitride, silicon oxide, silicon oxynitride, silicon oxycarbide, or silicon carbonitride.

12. The OLED display device according to claim 1, wherein the pixel defining layer comprises a top surface facing away from the base substrate, the first openings are recessed inward from the top surface, and at least some of the plurality of spacers are directly disposed on the top surface.

13. An OLED display device, comprising:
a base substrate;
a pixel defining layer comprising a top surface facing away from the base substrate and a plurality of first openings recessed inward from the top surface, wherein a material of the pixel defining layer is a polymer;
a plurality of OLED devices disposed on the base substrate at intervals and disposed in the plurality of first openings, respectively, wherein at least some of the OLED devices provide with inorganic layers, and the inorganic layers are made of an inorganic material; and
a plurality of spacers disposed on the base substrate and correspondingly arranged at positions where no inorganic layers disposed, wherein at least some of the spacers are disposed directly disposed on the top surface.

14. An OLED display device, comprising:
a base substrate;
a pixel defining layer comprising a plurality of first openings, wherein a material of the pixel defining layer is a polymer;
a plurality of OLED devices disposed on the base substrate at intervals and disposed in the plurality of first openings, respectively, wherein at least some of the OLED devices provide with inorganic layers, the inorganic layers are completely located in the first openings to cover the OLED devices, and the inorganic layers are made of an inorganic material; and
a plurality of spacers disposed on the base substrate and correspondingly arranged at positions where no inorganic layers disposed, wherein at least some of the spacers are disposed on the pixel defining layer, and a bonding force between the spacers and the pixel defining layer is larger than a bonding force between the spacers and the inorganic layers after heating.

15. The OLED display device according to claim 14, wherein the polymer of the pixel defining layer comprises at least one of phenol-formaldehyde polymers, acrylic esters, and fused cyclic olefin additions.

16. The OLED display device according to claim 14, wherein the spacers are made of a resin material.

17. The OLED display device according to claim 16, wherein the resin material comprises plastic, glass, or silicone resin materials.

18. The OLED display device according to claim 14, wherein the inorganic material comprises silicon nitride, silicon oxide, silicon oxynitride, silicon oxycarbide, or silicon carbonitride.

19. The OLED display device according to claim 14, wherein the pixel defining layer comprises a top surface facing away from the base substrate, the first openings are recessed inward from the top surface, and at least some of the plurality of spacers are directly disposed on the top surface.

* * * * *